United States Patent
Ruppert

(10) Patent No.: US 12,261,556 B2
(45) Date of Patent: Mar. 25, 2025

(54) MOTOR VEHICLE HAVING AN EXTERNALLY EXCITED SYNCHRONOUS MACHINE AND METHOD FOR ACTIVE DISCHARGING OF A CAPACITOR IN A HIGH-VOLTAGE NETWORK

(71) Applicant: AUDI AG, Ingolstadt (DE)

(72) Inventor: Daniel Ruppert, Lenting (DE)

(73) Assignee: AUDI AG, Ingolstadt (DE)

( * ) Notice: Subject to any disclaimer, the term of this patent is extended or adjusted under 35 U.S.C. 154(b) by 138 days.

(21) Appl. No.: 18/319,397

(22) Filed: May 17, 2023

(65) Prior Publication Data

US 2023/0378894 A1     Nov. 23, 2023

(30) Foreign Application Priority Data

May 19, 2022   (DE) .......................... 102022112558.0

(51) Int. Cl.
  *H02P 27/08*     (2006.01)
  *H02P 23/00*     (2016.01)
  *H05K 7/20*      (2006.01)

(52) U.S. Cl.
  CPC .............. *H02P 23/00* (2013.01); *H02P 27/08* (2013.01); *H05K 7/2089* (2013.01)

(58) Field of Classification Search
  CPC .. H02P 23/00; H02P 27/08; H02P 9/30; H02P 25/18; H02P 27/085; H05K 7/2089
  See application file for complete search history.

(56) References Cited

U.S. PATENT DOCUMENTS

| | | | |
|---|---|---|---|
| 2015/0236616 A1 | 8/2015 | Aldinger et al. | |
| 2019/0260286 A1 | 8/2019 | Appel et al. | |
| 2019/0320549 A1 | 10/2019 | Song et al. | |
| 2020/0212834 A1* | 7/2020 | Mazda | B60L 50/51 |

FOREIGN PATENT DOCUMENTS

| | | |
|---|---|---|
| CN | 107196546 A | 9/2017 |
| DE | 102014202717 B3 | 6/2015 |
| DE | 102018202661 A1 | 8/2019 |
| DE | 102020132571 B3 | 2/2022 |

\* cited by examiner

*Primary Examiner* — Muhammad S Islam
(74) *Attorney, Agent, or Firm* — Seed IP Law Group LLP

(57) ABSTRACT

The disclosure relates to a motor vehicle that includes an externally excited synchronous machine, an exciter circuit which, in operation, energizes an exciter winding of the externally excited synchronous machine, a power electronics layout connected to a voltage network and including at least one capacitor, wherein the exciter circuit includes at least one semiconductor switch in a discharge section that connects terminals of the voltage network other than the exciter winding, and a control device which, in operation, closes the at least one semiconductor switch of the discharge section of the exciter circuit to actively discharge the at least one capacitor.

12 Claims, 3 Drawing Sheets

MOTOR VEHICLE HAVING AN EXTERNALLY EXCITED SYNCHRONOUS MACHINE AND METHOD FOR ACTIVE DISCHARGING OF A CAPACITOR IN A HIGH-VOLTAGE NETWORK

BACKGROUND

Technical Field

The disclosure relates to a motor vehicle, having an externally excited synchronous machine, an exciter circuit associated with the externally excited synchronous machine to energize the exciter winding, and a power electronics layout connected to a high-voltage network, especially one comprising an inverter associated with the synchronous machine, having at least one high-voltage capacitor at the network side, especially an intermediate circuit capacitor and/or a suppression capacitor. In addition, the disclosure relates to a method for active discharging of the at least one capacitor in such a motor vehicle.

Description of the Related Art

Electric machines are used in hybrid and electric motor vehicles, and are associated with corresponding power electronics layouts or power electronics components, which are connected to a high-voltage onboard network at the vehicle side (in the following description, a high-voltage network for short). Power electronics layouts may involve, for example, drive system inverters, high-voltage DC converters, onboard chargers, electric air conditioning compressors, and/or electric heaters, which are connected to the high-voltage network. The operating voltage of the high-voltage network is usually more than 200 V and can lie in the range of 350 Volt to 860 Volt, for example.

Many such high-voltage components, i.e., power electronics layouts, may be associated with capacitors on the side with the connection to the high-voltage network, in particular intermediate circuit capacitors and/or suppression capacitors, such as suppression capacitors of X class. For reasons of user safety and functional safety, such capacitors are usually associated with circuits for their active discharging, by which the capacitors supposed to be rapidly discharged, for example in case of a fault.

Discharge circuits known in the prior art generally consist of a semiconductor switch element, such as an IGBT or a MOSFET, and an ohmic load, that is, a discharge resistance, by which the energy is converted into heat during the active discharging. Corresponding discharge requirements exist for the active discharging, such as prescribed discharge times and/or prescribed minimum voltage levels.

There are many options known in the prior art for implementing active discharging through a discharge circuit. What is problematical here is that the discharge resistance has to be very large, in particular massive in design, on account of the high intermediate circuit voltage or generally the voltage on the capacitor and the large discharge power needed. Due to the massive design on account of the large thermal load, the result is a large discharge resistance requiring a lot of design space, which needs to be installed separately inside the motor vehicle, for example, inside a housing accommodating the power electronics layout. For example, it has been proposed to secure cement resistors in such a housing.

As an alternative to massive discharge resistors requiring large design space, it has also been proposed to make use of a plurality of pulse-resistant SMD thick film resistors for the active discharging. However, these SMD thick film resistors are extremely costly and due to their number they require substantial space on the circuit board. When they are used for active discharging, they produce a lot of heat in the circuit board or on the board.

In summary, discharge circuits are used in the prior art for active discharging, being realized with discrete components, for example on traditional printed circuit boards. The cooling of the components of the discharge circuit is done by free convection into air at ambient temperature, especially inside a housing accommodating the power electronics layout.

As regards the functional safety, it must furthermore be assured that the active discharging can occur many times in direct succession, and therefore electric energy can be transformed into heat multiple times in succession. This brings additional high requirements for the robustness and the service life of the discharge circuits. In sum, extremely high requirements are placed on the thermal design of the discharge circuit, especially the discharge resistance. It may even be necessary to use multiple discharge resistors. Accordingly, a number of disadvantages exist.

Thus, there is a high cost expenditure in the prior art for material costs, such as those regarding the discharge resistors, the construction and connection technique, the connecting of the discharge resistors, the need for additional temperature measurement to monitor the discharge resistors and also because of the necessary over-dimensioning of the discharge circuit because of poor cooling connections. The development costs and development expenses in regard to the discharge circuits are very high, since there is an integration expense for the discharge resistors on a circuit board and/or inside the housing accommodating the power electronics layout. The discharge circuit must be designed with appropriate thermal mass, and additional filters and interference suppression may be needed for the temperature measurement. Finally, the discharge circuit or the discharge resistors are not very robust, on account of the thermal stress.

DE 10 2014 202 717 B3 discloses a system for capacitance determination of an intermediate circuit capacitor and a method for actuating an inverter, where it is proposed for the capacitance measurement to discharge the intermediate circuit capacitor, which feeds an inverter with DC voltage, at least partly across the semiconductor switch of the inverter in a linear or active operation, so that the heating of the semiconductor switch can be set in relation to the voltage loss at the intermediate circuit capacitor. The thermal energy converted during the discharging is inferred by way of a thermal model.

CN 107196546 A discloses an active discharging system of a motor controller. It is proposed here to operate semiconductor switches in an inverter, associated with an intermediate circuit capacitor, in a linear region, so that they can provide a discharge resistance.

US 2019/0320549 A1 discloses an inverter module for the power supply of an electric motor vehicle. An inverter housing arrangement here can have a circuit board for the active discharging, which comprises an active discharge circuit.

BRIEF SUMMARY

Therefore, embodiments of the disclosure provide an easily implemented way of discharging capacitors, especially intermediate circuit capacitors, in a motor vehicle, saving on costs, expense, and complexity.

It is proposed according to the disclosure in a motor vehicle of the kind mentioned above that the exciter circuit comprises at least one semiconductor switch in a discharge section that connects the terminals of the high-voltage network but not including the exciter winding, and the motor vehicle moreover comprises a control device actuating the exciter circuit, which is designed for the active discharging of the at least one capacitor by closing the at least one semiconductor switch of the discharge section.

The disclosure thus utilizes the fact that, due to the use of an externally excited synchronous machine, an exciter circuit is also present, which can be used to realize the active discharging in integrated manner. For this, the exciter circuit is designed such that a discharge section exists, situated outside the exciter winding and therefore bridging over the exciter winding, producing by way of the at least one semiconductor switch of the discharge section an electrically conductive connection between the terminals of the high-voltage network to the exciter circuit as soon as all of the at least one semiconductor switch are closed. By this electrically conducting connection produced by the discharge section, a discharging of all capacitors provided at the high-voltage network side can occur, especially intermediate circuit capacitors and/or suppression capacitors. Upon presence of a signal in the control device indicating the need for an active discharging, the control device can actuate the at least one semiconductor switch of the discharge section to close and thus make possible a discharging across the discharge section. An active discharging can always be provided when needed in regard to user safety and functional safety. For example, such a discharging can be undertaken when work is being done on the motor vehicle, when an accident occurs, and/or when some other fault occurs, especially one involving the high-voltage network and the high-voltage components connected to it. Such situations and signals are commonly known in regard to the discharge circuits used in the prior art thus far.

Existing topologies only need to be slightly modified for this, for example they can be expanded with at least one further semiconductor switch. Thanks to the modification of the exciter circuit, the traditional discharge circuit known in the prior art, realized for example as part of an inverter component, can be eliminated. No additional expense is required in regard to the construction and the connection technique, since the exciter circuit is present in any case and can perform an extra function in integrated manner. The design is optimized and the overall system becomes significantly smaller. Moreover, the robustness of the active discharging is improved. As mentioned, the bases for the integration is the use of an externally excited synchronous machine, which requires an exciter circuit for the exciter power. In other words, the "active discharging" portion of the circuit is represented by the exciter circuit, which can be provided for example as an exciter power module, and the at least one capacitor, especially an intermediate circuit capacitor, can be actively discharged, for example in event of a fault, across the discharge section, which can form for example a new phase branch in the exciter circuit. Thus, a discrete discharge circuit is no longer necessary.

It can be provided here with special advantage that at least a portion of the discharge resistance is provided by an operation of at least one of the at least one semiconductor switches in the linear region. It is therefore conceivable to not close entirely at least one of the at least one semiconductor switches of the discharge section, but instead to utilize a linear operation through the control device, in which this has a particular ohmic resistance which can be used as the discharge resistance. Thanks to the use of at least one of the at least one semiconductor switches of the discharge section as a resistance, especially in the sense of a "current valve," no discrete resistor component need be provided.

Thermal energy is also ultimately produced by the discharging in the method according to the disclosure, especially in the region of the exciter circuit itself, for example at the at least one semiconductor switch—especially when operated in the linear region. In this regard, one feasible embodiment of the present disclosure can provide that the control device is designed for at least temporary pulse width modulated actuating of at least one of the at least one semiconductor switches of the discharge section during the active discharging. Thus, thanks to a pulse width modulation, a very fast switching can be produced between an opened and a closed state of the semiconductor switch actuated in this way, making it possible to adapt suitably the portion of time during which a current flow occurs, so that no excessive production of heat and/or no thermal load occurs, but on the other hand it is fast enough for a discharging of the at least one capacitor to occur, in particular meeting the requirements. Thus, at least one of the at least one semiconductor switches of the discharge section can be "timed," so to speak. In this way, it is possible to undertake a suitably adapted discharging by way of pulse width modulation even in the case of large voltages being discharged, such as intermediate circuit voltages, and/or less suitable environmental conditions, such as the ambient temperature which is present in any case or also the temperature on at least one of the at least one semiconductor switches. While it is of course perfectly natural and conceivable to set a fixed duty cycle of the pulse width modulation based on a worst case scenario, one especially feasible modification of the disclosure proposes that the control device is designed for setting the duty cycle of the pulse width modulation in dependence on the magnitude of the voltage being discharged and/or on the temperature of at least one of the at least one semiconductor switches of the discharge section as measured by way of a measuring unit. In other words, the duty cycle, that is the length of the actuating pulses, of the pulse width modulation can depend on the magnitude of the intermediate circuit voltage being discharged and/or the semiconductor temperature. The duty cycle can be regulated by the control device, which can correspond to a central control device.

In an especially advantageous embodiment of the present disclosure, the basic normal configuration of the exciter circuit can be modified slightly to provide the discharge section. Thus, the exciter circuit can comprise a bridge circuit forming at least one half-bridge, having four branches each that connects a connection point of the exciter winding to one terminal of the high-voltage network, and each comprising a freewheeling diode, wherein the at least one discharge section comprises two branches that connect the terminals of the high-voltage network to semiconductor switches bridging the respective freewheeling diodes. The use of a half bridge in the exciter circuit makes it possible to provide certain desired additional states of the exciter circuit, in particular a freewheeling and/or an active short circuit. In the context of the present disclosure it may be especially advisable to provide the active short circuit at least in regard to the exciter winding during the active discharging, which is possible in especially simple manner in the embodiment described here. Namely, it can be provided in particular that a bridging semiconductor switch is also associated, in a short circuit section formed by a branch of the discharge section and by a further branch between the connection points of the exciter winding, with the freewheeling diode belonging to the further branch, and the control device in order to produce a safe condition during the active discharging is also adapted to close the semiconductor switch of the further branch in order to produce an active short circuit condition of the exciter winding. This means that the externally excited synchronous machine can be operated in a safe condition, namely, an active short circuit state, in the context of an active discharging. An active short circuit of the exciter winding ensures that no energy is fed back by the rotating electric machine to the high-voltage network, especially the intermediate circuit, during the active discharging.

In particular, one can start from a half-bridge architecture, making use of two semiconductor switches, each of which can connect one of the terminals of the exciter winding to one of the terminals of the high-voltage network, bridging over the freewheeling diode. Then, in order to provide the discharging section, and therefore implement the present embodiment, one need only provide in one of the other branches a semiconductor switch, bridging over the freewheeling diode, so that when the three switches are closed there occurs on the one hand an active discharging across the discharge section, but on the other hand there is also the active short circuit of the exciter winding, where the branch belonging to the added semiconductor switch, so to speak, belongs to both the discharge section and the short circuit section.

In this context, when a pulse width modulated actuation is used, it is preferable for the control device to be designed to select the semiconductor switch not belonging to the short circuit section for the pulse width modulated actuation and/or to operate in the linear region. In this way, even at times outside of the pulse, the active short circuit will not be affected by switching events and/or by ohmic resistances used as discharge resistors and remains the same during the entire discharging process.

Moreover, it is especially advisable for the externally excited synchronous machine to be connected by way of the inverter, especially a three-phase one, to the high-voltage network, and the control device in order to produce a safe condition during the active discharging is also designed to actuate the inverter in order to produce an active short circuiting. In this case, therefore, an active short circuit is brought about not only through the short circuit section in relation to the exciter winding, but also in relation to the windings connected across the inverter. It should be mentioned in general in this place that the exciter winding can be provided with special advantage on the part of the rotor, while the stator windings are connected across the inverter to the high-voltage network, so that they can feed in the electric power generated there, or instead the externally excited synchronous machine can be operated with electric power from the high-voltage network, especially for the propulsion of the motor vehicle.

In other words, the stator windings are then connected across the inverter to the high-voltage network, preferably operating in three phases. If both the inverter and the exciter circuit are actuated accordingly with respect to the short circuit section, all of the windings of the externally excited synchronous machine will be in the active short circuit and in particular no further power can be fed into the high-voltage network, which would then have to be dissipated in addition. Thus, the externally excited synchronous machine is furthermore in a safe condition during the active charging operation, so that the greatest possible functional safety exists, along with maximum integration and robustness. It should be further mentioned in this context that at least one of the at least one capacitors is associated with or can belong to the inverter as an intermediate circuit capacitor, as is basically familiar.

The present disclosure achieves further particular advantages when the motor vehicle furthermore contains a cooling device having a cooling element, which is thermally connected to the exciter circuit for heat dissipation. Thus, if the exciter circuit is cooled in any case, the heat arising in the course of the active discharging can also be dissipated by way of the cooling element, so that the thermal load due to the active discharging is kept low in the corresponding circuit portion, especially along the discharging section. The cooling element in particular can have at least one duct and/or cavity with cooling fluid flowing through it, in order to accomplish a better cooling effect in this regard. The duct and/or the cavity can be connected to a cooling circuit for the cooling fluid, which can be part of the cooling device.

In this context, it can also be provided especially advantageously that at least a portion of the power electronics layout is also thermally connected to the cooling element for heat dissipation, especially as at least one power module comprising a housing. For example, power modules for the different phases in an inverter can be provided in their own housings, which can be arranged on the cooling element, for example next to each other, and thermally connected to it. In addition to the power modules, the exciter circuit is also thermally connected to the cooling element, inasmuch as it can be realized for example as an exciter power module, which can be attached to the cooling element similar to the power modules of the inverter. In this way, an extremely compact and efficient cooling arrangement is obtained, which makes possible a fast, effective, robust and less thermally burdensome active discharge function, since the exciter circuit is cooled and the function of active discharging is also integrated in the exciter circuit.

In summary, the present disclosure allows a distinct reduction of the cost expense for material costs, since discharge resistors and discrete actuation semiconductors can be eliminated. In particular when the exciter circuit is actively cooled by way of the cooling element, the at least one semiconductor switch of the discharge section can be smaller in design, since it is attached to the active cooling of the cooling device. A large number of discharge resistors are no longer necessary. The cost expense is also significantly reduced during the fabrication and assembly, as is the labor expense, so no further expense is needed in regard to the discharge resistors and possibly other discrete components of the discharge circuit. Especially in the case of the cooling connection, the robustness of the "active discharging" portion of the circuit is increased, the robustness being increased already thanks to the integration of the function in the exciter circuit. In general, the elimination of the discharge resistors reduces the weight, and the required design space is less. The flexibility is enhanced.

Besides the motor vehicle, the disclosure also relates to a method for active discharging of a capacitor in a high-voltage network of a motor vehicle of the kind according to the disclosure, wherein upon presence of a signal in the control device indicating the need for an active discharging, the control device actuates the at least one semiconductor switch of the discharge section to close. All of the remarks regarding the motor vehicle according to the disclosure can be applied accordingly to the method according to the disclosure, with which the already mentioned advantages can likewise be achieved. In particular, a pulse width modulated actuation of at least one of the at least one semiconductor switches can be done, as described, and the duty cycle can be set in particular depending on the magnitude of the voltage being discharged and/or the temperature measurement value. Moreover, at least one portion of the discharge resistance can be provided by an operation of at least one of the at least one semiconductor switches in the linear region.

BRIEF DESCRIPTION OF THE DRAWINGS

Further benefits and details of the present disclosure will emerge from the exemplary embodiments described below, as well as the drawings.

DETAILED DESCRIPTION

Figure 1:
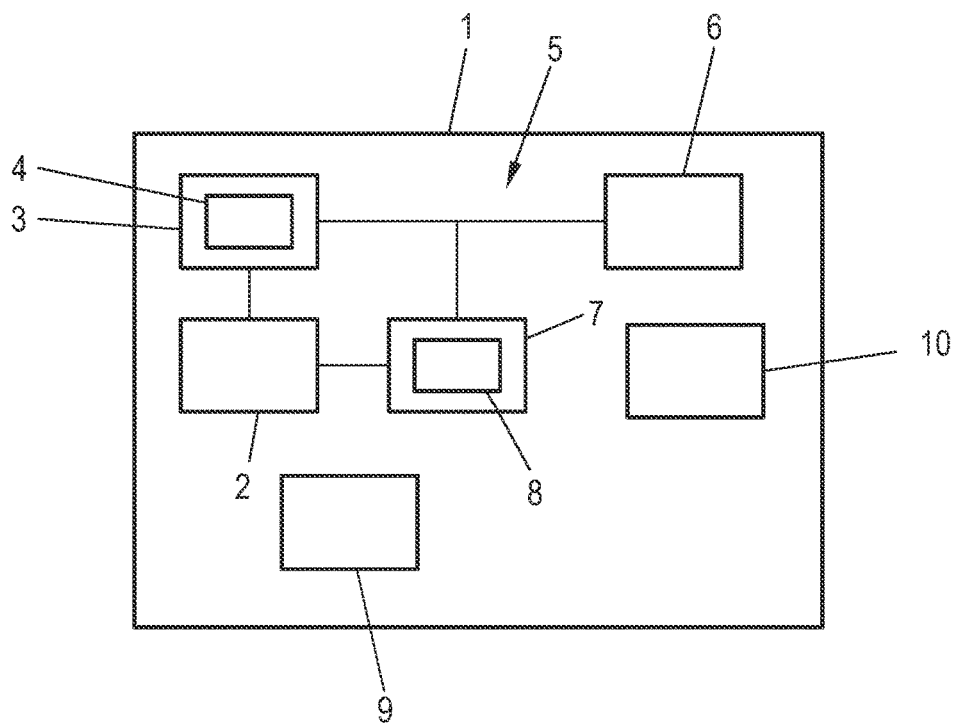
FIG. 1 shows a schematic of a motor vehicle according to the disclosure.

FIG. 1 shows a schematic of a motor vehicle 1 according to the disclosure, in the present instance an electric motor vehicle. The electric motor vehicle 1 comprises, in a drive train not otherwise shown, an electric machine, which is configured here as an externally excited synchronous machine 2, also serving as the electric motor for the electric motor vehicle 1. The externally excited synchronous machine 2 comprises a rotor having an exciter winding, not otherwise shown here for clarity of the drawing, as is the case for the stator windings of the stator, there being provided one for each of the three phases. The exciter winding is connected across a high-voltage component 3, comprising an exciter circuit 4, to a high-voltage network 5 of the motor vehicle 1, having a higher voltage than a low-voltage network of the motor vehicle 1, not being shown here. The operating voltage of the high-voltage network 5 can lie for example in a range of over 200 Volt, especially 350 to 860 Volt, this being a DC voltage network. It is fed from a battery 6.

The stator windings of the externally excited synchronous machine 2 are connected across a power electronics layout 7, comprising an inverter 8, to the high-voltage network 5. Of course, further high-voltage components or network components can also be provided in the high-voltage network 5 and connected to it, such as a DC voltage converter provided between the low-voltage network and the high-voltage network 5, an onboard charger for the battery 6, an electric air conditioning compressor and/or an electric heater. In the present instance, at least the power electronics layout 7 with the inverter 8 comprises an intermediate circuit having an intermediate circuit capacitor, while such electric energy storing capacitors, which may include suppression capacitors as well as intermediate circuit capacitors, can also be provided in other components, being hooked up in parallel.

The motor vehicle 1 moreover comprises a cooling device 9, which also includes a cooling circuit for a cooling fluid, to be further explained below, bringing about a cooling of the inverter 8 and the exciter circuit 4 by way of a common cooling element.

The operation of the high-voltage network and the high-voltage components connected to it is controlled in the present instance by a central control device 10, which is also designed in particular to carry out the method according to the disclosure.

Figure 2:
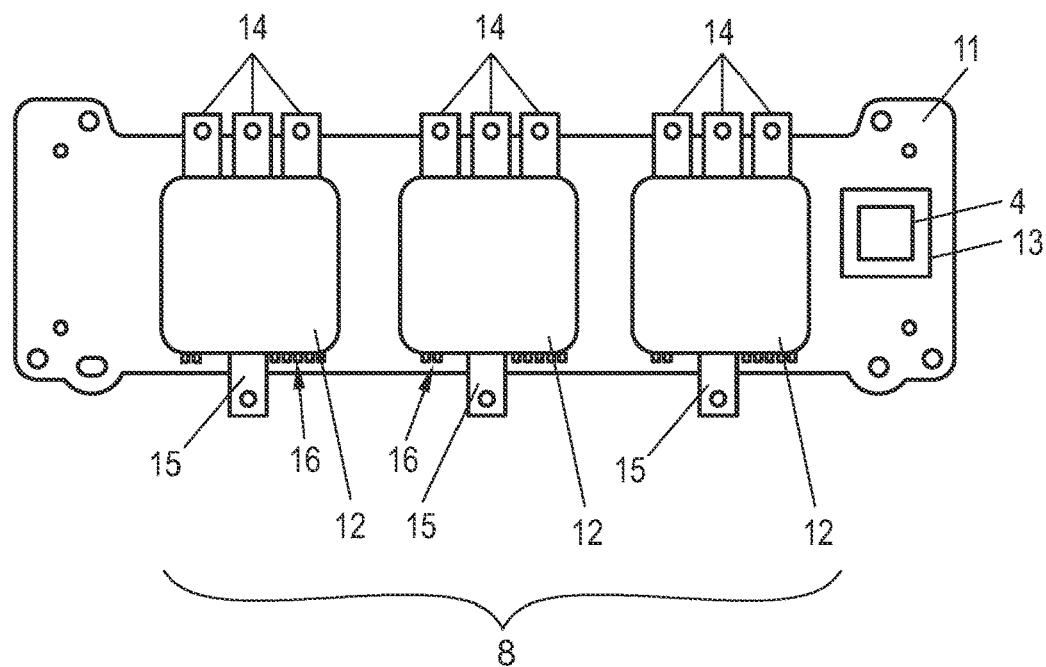
FIG. 2 shows a view of a cooling element with power modules thermally connected to it.

FIG. 2 shows as an example a cooling element 11 of the cooling device 9, which in the present instance comprises at least one duct and/or at least one cavity, not otherwise shown, through which the cooling fluid in the cooling circuit flows. Fastened on the cooling element 11 and thermally connected to it for heat dissipation are not only the power modules 12 for each phase, together forming the inverter 8, but also an exciter power module 13, in which the exciter circuit 4 is accommodated in a housing, so that this can also be cooled by way of the cooling element 11.

The power modules 12 can have housings containing the corresponding power electronics components, especially including semiconductor switches. In the present instance, the power terminals 14 of the power modules 12 at the high-voltage network 5 as well as the power terminals 15 to the stator windings for the individual phases as well as corresponding actuation terminals 16 are also shown. These are not shown here for the exciter power module 13, for sake of clarity of drawing.

Figure 3:
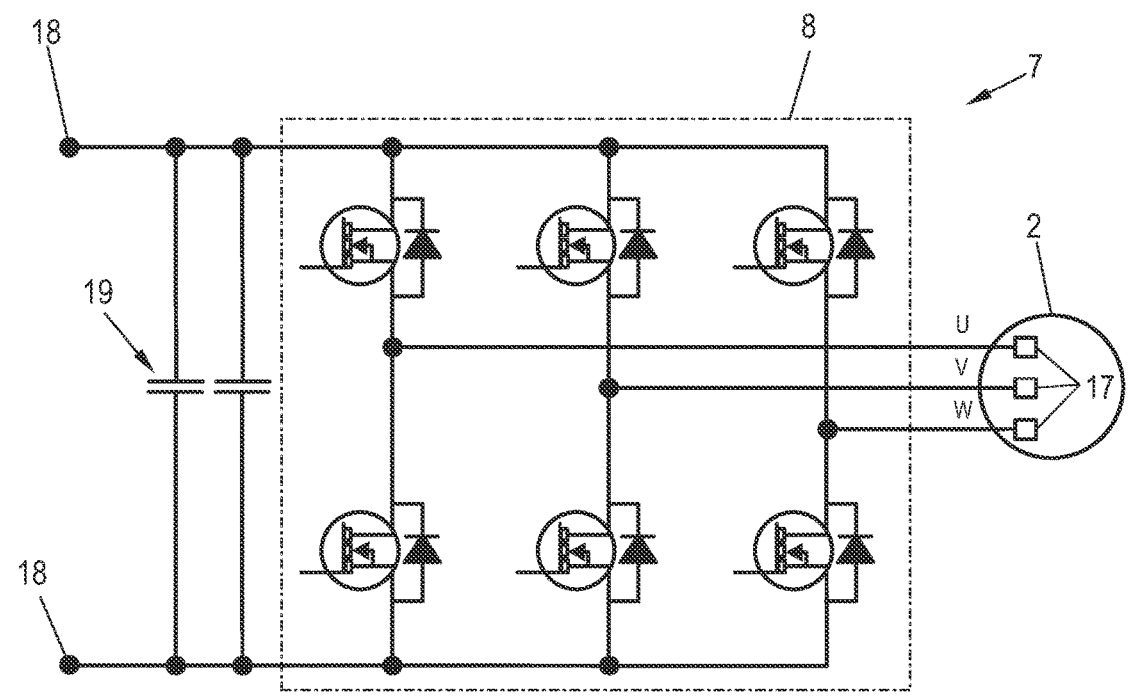
FIG. 3 shows a circuit diagram of a power electronics layout comprising an inverter.

FIG. 3 shows schematically a circuit diagram of the power electronics layout 7 with the inverter 8 as a circuit diagram. As can be seen, the inverter 8 comprises a B6 bridge circuit with corresponding components for each of three phases U, V and W, which are connected to corresponding stator windings 17 (here only suggested) of the stator of the externally excited synchronous machine 2. In the present case, as an example, two intermediate circuit capacitors 19 are shown for the high-voltage network 5, cf. the terminals 18, although configurations are also conceivable in which the inverter 8 comprises only one intermediate circuit capacitor 19 or more than two intermediate circuit capacitors 19.

Figure 4:
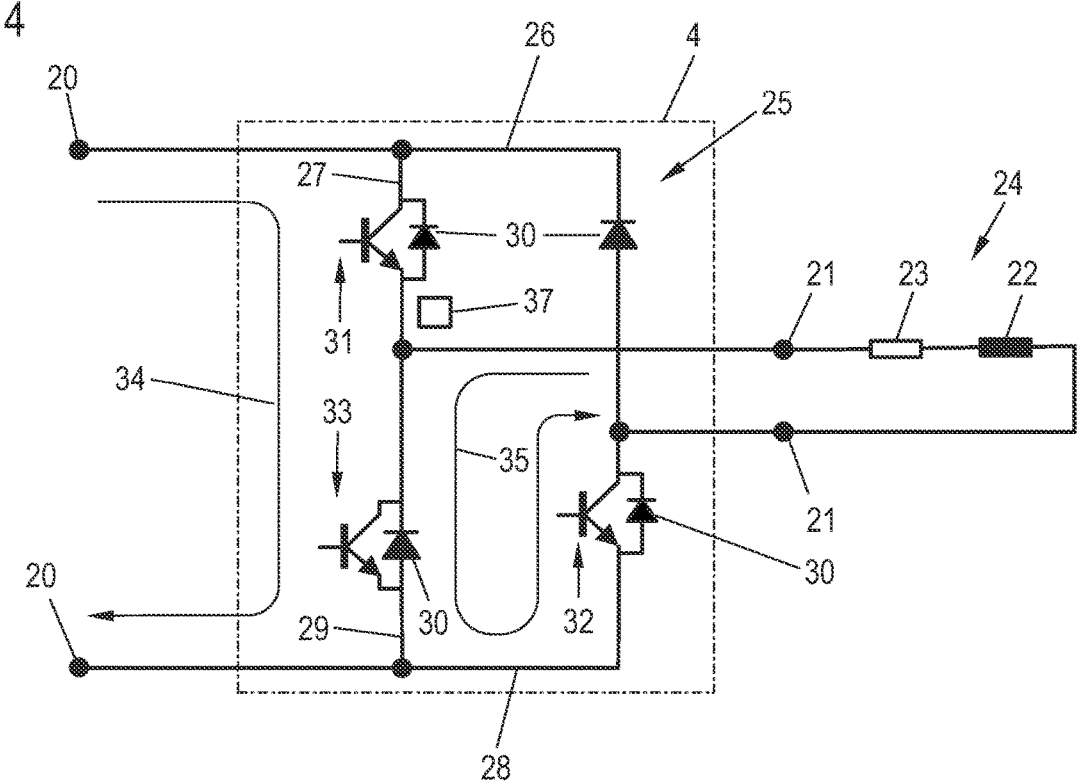
FIG. 4 shows a circuit diagram of an exciter circuit expanded for an active discharging.

In fault situations, during accidents, and for repair purposes, and possibly also in other cases where the user safety and functional safety must be assured, the intermediate capacitors 19 must be actively discharged as soon as possible, so that the least possible voltage remains in the high-voltage network 5. This discharging is done in the present instance across the exciter circuit 4, which is designed accordingly, as shown by the circuit diagram of FIG. 4.

As can be seen, the exciter circuit 4 comprises, between the terminals 20 for the high-voltage network and connection points 21 for the exciter winding 24, indicated here by its inductance 22 and its resistance 23 and corresponding to the rotor winding, a bridge circuit 25 in the manner of a slightly modified half-bridge. This comprises four branches 26, 27, 28, 29, in each of which there are provided freewheeling diodes 30. In order to obtain a half-bridge, the semiconductor switches 31, 32 are provided in the branch 27 and in the branch 28, bridging over the freewheeling diodes 30, and which can be MOSFETs or IGBTs, for example. However, in the present case, the corresponding freewheeling diode 30 in the branch 29 is also bridged over by a semiconductor switch 33, which can likewise be a MOSFET or IGBT.

In this way, the branches 27 and 29 produce the indicated discharge section 34 between the terminals 20 for the high-voltage network 5, since current can flow with low impedance between the terminals 20 when the semiconductor switches 31, 33 are closed by way of actuation by the control device 10, so that the intermediate circuit capacitors 19 are discharged. The discharge resistance is provided by the operation of one of the semiconductor switches 31, 33 in the linear region (ohmic region). If the semiconductor switch 32 is also closed at the same time, the exciter winding 24 is short circuited, so that the branches 28 and 29 together form a short circuit section 35.

Figure 5:
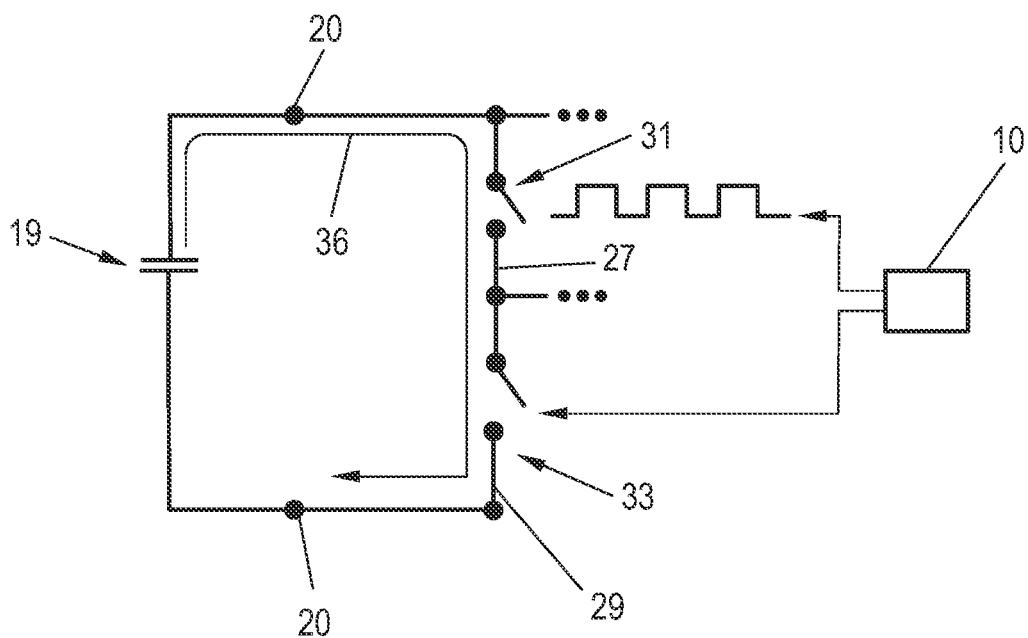
FIG. 5 shows a schematic to explain the active discharging process.

Now, if a signal indicating the need for an active discharging is present in the control device 10, which can also actuate the semiconductor switches 31, 32, 33 of the exciter circuit 4, this can make the discharge section 34 low-impedance conducting by closing the semiconductor switch 31 and 33, so that, as shown schematically by the arrow 36 in FIG. 5, the charge of the intermediate circuit capacitors 19, shown here schematically by only one capacitor, can drain away. The semiconductor switch 33 remains permanently closed, in order to maintain undisturbed the active short circuit of the exciter circuit 24 existing on account of the just closed semiconductor switch 32. However, as indicated in FIG. 5, the semiconductor switch 31 is actuated by pulse width modulation, and the control device 10 has chosen the duty cycle in dependence on the voltage being discharged and the temperature measured on the semiconductor switch 31 by a measuring unit 37 only suggested in FIG. 4, so that no thermal overload occurs and an active discharging is made possible for many cycles by way of the exciter circuit 4. A discharge resistance is provided by a linear operation of one of the semiconductor switches 31, 33, here being likewise the semiconductor switch 31.

In parallel with the active short circuit of the exciter winding 24, the stator windings 17 are also switched to an active short circuit condition, either by closing all low side semiconductor switches of the B6 bridge of the inverter 8 (so-called low side ACS) or by closing all high side semiconductor switches (high side ACS). Thanks to these active short circuits (ACS) of both the stator windings 17 and the exciter winding 24, no energy is fed back into the high-voltage network 5 during the active discharging by the rotating externally excited synchronous machine 2. Thanks to the connection of the exciter circuit 4 to the active cooling by way of the cooling element 11, which also cools the inverter 8, this cooling is also active during the active discharging and this function can be implemented in a distinctly smaller and more cost-effective manner. Besides the integration of the "active discharging" function in the exciter circuit 4, this is at the same time able, thanks to appropriate actuation by way of the control device 10, to bring about the active short circuit (ACS) for the exciter winding 24, so that a safe condition of the externally excited synchronous machine 2 obtains and a discharging can be done quickly and without complications.

German patent application no. 102022112558.0, filed May 19, 2022, to which this application claims priority, is hereby incorporated herein by reference, in its entirety.

Aspects of the various embodiments described above can be combined to provide further embodiments. In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. A motor vehicle, comprising:
   an externally excited synchronous machine;
   an exciter circuit which, in operation, energizes an exciter winding of the externally excited synchronous machine;
   a power electronics layout connected to a voltage network and including at least one capacitor,
   wherein the exciter circuit includes at least one semiconductor switch in a discharge section that connects terminals of the voltage network other than the exciter winding; and
   a control device which, in operation, closes the at least one semiconductor switch of the discharge section of the exciter circuit to actively discharge the at least one capacitor.

2. The motor vehicle according to claim 1, wherein the control device, in operation, performs pulse width modulation actuation of at least one of the at least one semiconductor switches of the discharge section that causes the at least one of the at least one semiconductor switches of the discharge section to operate in a linear region during active discharging of the at least one capacitor.

3. The motor vehicle according to claim 2, wherein the control device, in operation, sets a pulse width modulation duty cycle based on a magnitude of voltage being discharged by the at least one capacitor or on a temperature of the at least one of the at least one semiconductor switches of the discharge section as measured by way of a measuring unit.

4. The motor vehicle according to claim 1, wherein the exciter circuit includes a bridge circuit forming at least one half-bridge, having four branches each connecting one of a plurality of connection points of the exciter winding to one of the terminals of the voltage network, and each one of a plurality of freewheeling diodes, wherein the discharge section comprises two branches that connect the terminals of the voltage network to the semiconductor switches bridging the freewheeling diodes.

5. The motor vehicle according to claim 4, wherein in at least one short circuit section is formed by a first branch of the discharge section and a second branch between the connection points of the exciter winding, wherein the freewheeling diode of the second branch is provided with a semiconductor switch (32) bridging the freewheeling diode of the second branch, and the control device, in operation, closes the semiconductor switch of the second branch in order to produce an active short circuit condition of the exciter winding.

6. The motor vehicle according to claim 5, wherein for pulse width modulation actuation of one of the semiconductor switches of the discharge section, the control device, in operation, selects the one of the semiconductor switches not belonging to the short circuit section for the pulse width modulation actuation.

7. The motor vehicle according to claim 5, wherein the power electronics layout includes an inverter, and wherein the externally excited synchronous machine is connected by way of the inverter to the voltage network, and the control device, in operation, actuates the inverter in order to produce an active short circuit.

8. The motor vehicle according to claim 7, wherein at least one capacitor of the at least one capacitor is associated with or belongs to the inverter as an intermediate circuit capacitor.

9. The motor vehicle according to claim 1, further comprising a cooling device having a cooling element which is thermally connected to the exciter circuit for heat dissipation.

10. The motor vehicle according to claim 9, wherein at least a portion of the power electronics layout is thermally connected to the cooling element for heat dissipation.

11. The motor vehicle according to claim 1, wherein the at least one capacitor includes an intermediate circuit capacitor or a suppression capacitor.

12. A method for active discharging of a capacitor in a voltage network, the method comprising:
providing a motor vehicle including an externally excited synchronous machine, an exciter circuit that energizes an exciter winding of the externally excited synchronous machine and that includes at least one semiconductor switch in a discharge section that connects terminals of the voltage network other than the exciter winding, a power electronics layout connected to a voltage network and including at least one capacitor, and a control device; and
actuating, by the control device, the at least one semiconductor switch of the discharge section of the exciter circuit to close upon presence of a signal in the control device indicating a need for active discharging of the capacitor.

* * * * *